United States Patent
Campbell et al.

(10) Patent No.: US 10,070,558 B2
(45) Date of Patent: Sep. 4, 2018

(54) IMMERSION COOLED ELECTRONIC ASSEMBLIES

(71) Applicant: Hamilton Sundstrand Corporation, Charlotte, NC (US)

(72) Inventors: Kris H. Campbell, Poplar Grove, IL (US); Charles Shepard, DeKalb, IL (US); Shin Katsumata, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 15/093,637

(22) Filed: Apr. 7, 2016

(65) Prior Publication Data

US 2017/0295670 A1   Oct. 12, 2017

(51) Int. Cl.
 H05K 7/20 (2006.01)
 H05K 5/06 (2006.01)

(52) U.S. Cl.
 CPC .......... *H05K 7/20236* (2013.01); *H05K 5/06* (2013.01); *H05K 5/068* (2013.01); *H05K 7/203* (2013.01); *H05K 7/2039* (2013.01); *H05K 7/20318* (2013.01); *H05K 7/20927* (2013.01); *H05K 7/20936* (2013.01)

(58) Field of Classification Search
 CPC ....... H05K 7/20236; H05K 5/06; H05K 7/203
 USPC ............ 361/700, 679.46, 688; 73/729.1, 708
 See application file for complete search history.

(56) References Cited

U.S. PATENT DOCUMENTS

| | | | |
|---|---|---|---|
| 4,740,866 A | 4/1988 | Kajiwara et al. | |
| 4,847,731 A | 7/1989 | Smolley | |
| 5,206,791 A | 4/1993 | Novotny | |
| 5,373,417 A * | 12/1994 | Barrett | H01L 23/42 165/80.4 |
| 6,230,684 B1 * | 5/2001 | Furuhashi | F02M 55/025 123/456 |
| 7,165,413 B2 | 1/2007 | Symons | |
| 7,383,736 B2 * | 6/2008 | Esnouf | A61M 16/044 128/205.23 |
| 7,458,413 B2 | 12/2008 | Mok | |
| 8,619,425 B2 * | 12/2013 | Campbell | H05K 7/20809 165/80.4 |
| 8,937,383 B2 | 1/2015 | Laquer et al. | |
| 8,953,317 B2 * | 2/2015 | Campbell | H05K 7/203 165/104.33 |
| 9,049,800 B2 | 6/2015 | Shelnutt et al. | |

(Continued)

FOREIGN PATENT DOCUMENTS

DE   10152260 A1   4/2003

OTHER PUBLICATIONS

Extended European Search Report dated Sep. 14, 2017 from European Patent Office for European Application No. EP17162294.7.

Primary Examiner — Mandeep S Buttar
(74) Attorney, Agent, or Firm — Locke Lord LLP; Scott D. Wofsy; Christopher J. Cillié

(57) ABSTRACT

An immersion cooled electronics arrangement includes a sealed housing, a coolant contained within the sealed housing, and an electronic device disposed within the sealed housing. The sealed housing has a variable-volume alterable between at least a first volume and a second volume in response to changes in pressure within the sealed housing to reduce the rate of pressure change in the sealed housing over time from heating of the coolant.

16 Claims, 5 Drawing Sheets

(56) References Cited

U.S. PATENT DOCUMENTS

| | | | |
|---|---|---|---|
| 2008/0302115 A1 | 12/2008 | Eknes et al. | |
| 2010/0328889 A1 | 12/2010 | Campbell et al. | |
| 2011/0315344 A1* | 12/2011 | Campbell | F28F 3/04 |
| | | | 165/80.4 |
| 2015/0060009 A1 | 3/2015 | Shelnutt et al. | |
| 2015/0070846 A1* | 3/2015 | Shelnutt | H05K 7/203 |
| | | | 361/700 |
| 2016/0094911 A1* | 3/2016 | Kropf | H04R 1/44 |
| | | | 381/334 |

* cited by examiner

IMMERSION COOLED ELECTRONIC ASSEMBLIES

BACKGROUND OF THE INVENTION

1. Field of the Invention

The present disclosure relates to electrical systems, and more particularly to heat removal from electronics in electrical systems.

2. Description of Related Art

Throughout the aerospace industry the electrical power requirements of modern aircraft are steadily increasing. These increased power requirements, in conjunction with the harsh operating environments aircraft typically experience, create a demand for higher power density electronic devices. Electrical power applied to higher power density electronics can be accompanied by relatively high rates of heat generation from resistive heating of electrical components, which must be managed within the device and removed from such devices in order to ensure reliable operation of such devices.

Several cooling techniques may be employed by such electrical systems to remove heat from electrical devices. Examples of cooling arrangements include conduction cooling, natural convection cooling, radiation cooling, forced-air cooling, and liquid cooling. Increasing power density has led to interest in immersion cooling in certain applications, where a liquid is typically placed in direct contact with an electronic device. Immersion cooling typically requires that the container housing a liquid coolant have sufficient mechanical robustness to withstand stress associated with pressure change of the liquid within the container from heating.

Such conventional methods and systems have generally been considered satisfactory for their intended purpose. However, there is still a need in the art for improved immersion cooling systems. The present disclosure provides a solution for this need.

SUMMARY OF THE INVENTION

An immersion cooled electronics arrangement includes a sealed housing, a coolant contained within the sealed housing, and an electronic device disposed within the sealed housing. The sealed housing has a variable-volume alterable between at least a first volume and a second volume in response to changes in pressure within the sealed chamber to reduce the rate of pressure change in the sealed housing over time from heating of the coolant.

In certain embodiments, the coolant can include a dielectric coolant. The electronic device can be at least partially submerged within the coolant. The electronic device can include one or more of a capacitor, an inductor, a printed circuit board, a solid-state switch device, and a heat sink. The electronic device can be a solid-state power converter or a motor controller for a vehicle electrical system. The sealed housing can have a variable internal volume. The sealed housing can have a fixed internal volume. A variable-volume chamber can be disposed within the housing. The variable-volume chamber can be submerged within the coolant. An interior of the variable-volume chamber can be fluidly isolated from the coolant.

In accordance with certain embodiments, a gas can be sealed within the variable-volume chamber. The variable-volume chamber can be evacuated. The variable-volume chamber can be in fluid communication with the environment external to the sealed housing. The variable-volume chamber can be defined within a bellows. The bellows can include an elastic body that defines the variable-volume chamber. The bellows can be metallic and can include aluminum, steel, and/or alloys thereof. It is contemplated that the bellows can have a spring constant, and the spring constant can be sized to control the volume of the variable-volume chamber of the bellows within a predetermined pressure range.

It is also contemplated that, in accordance with certain embodiments, an ullage space can be defined within the sealed housing. The ullage space can be occupied by coolant in a vapor phase. A condenser can be disposed within the ullage space for condensing the vapor phase coolant into liquid phase coolant. A heat exchanger can be coupled to the sealed housing on a side of the housing opposite the condenser. The heat exchanger can be in thermal communication with the electronic device through the coolant. The variable-volume chamber can be disposed within the ullage space.

A vehicular electrical system includes an immersion cooled electronics arrangement as described above. A bellows is submerged within the coolant and defines within its interior a variable-volume chamber. The variable-volume chamber is fluidly isolated from the coolant and is deformable such that the variable-volume chamber displaces a first volume of coolant and a second volume of coolant according to the temperature of the coolant.

A method of controlling pressure within an immersion cooled electronics arrangement includes heating coolant contained within a sealed housing using an electronic device disposed within the housing, increasing pressure within the sealed housing with the heated coolant, and decreasing volume of a variable-volume chamber disposed within the housing using the increased pressure within the sealed housing.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
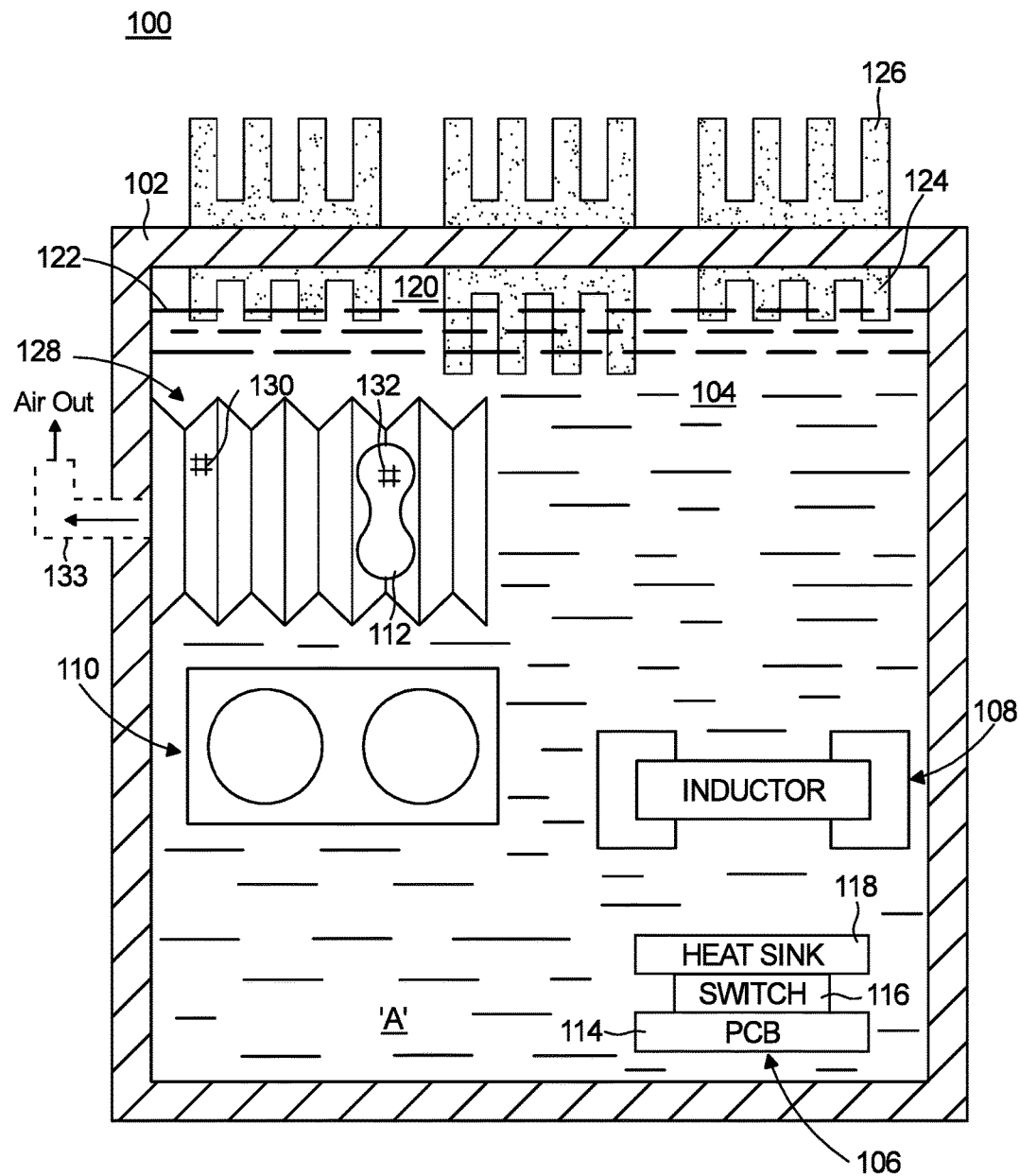
FIG. 1 is a schematic view of an exemplary embodiment of an immersion cooled electronics arrangement constructed in accordance with the present disclosure, showing a variable-volume chamber submerged within coolant contained within a sealed housing.

Reference will now be made to the drawings wherein like reference numerals identify similar structural features or aspects of the subject disclosure. For purposes of explanation and illustration, and not limitation, a partial view of an exemplary embodiment of an immersion cooled electronics arrangement in accordance with the disclosure is shown in FIG. 1 and is designated generally by reference character 100. Other embodiments of immersion cooled electronics arrangements and methods of removing heat from such arrangements in accordance with the disclosure, or aspects thereof, are provided in FIGS. 2-5, as will be described. The systems and methods described herein can be used in vehicular electrical systems, such as in motor controllers and/or power converters for aircraft electrical systems, though the present disclosure is not limited power converters, motor controllers, or to aircraft electrical systems in general.

Referring to FIG. 1, immersion cooled electronics arrangement 100 is shown. Immersion cooled electronics arrangement 100 includes a sealed housing 102 and a coolant 104 contained within sealed housing 102. One or more electronic devices, e.g., a printed circuit board (PCB) arrangement 106, an inductor 108, and a capacitor 110, are disposed within sealed housing 102 and submerged within coolant 104. A variable-volume chamber 112 is also disposed in sealed housing 102 and submerged within coolant 104, variable-volume chamber 112 being adapted and configured to displace a differential volume of coolant according to the temperature of coolant 104 to limit the pressure change within sealed housing 102 than would otherwise be associated with the temperature change.

Coolant 104 is electrically insulative, thermally conductive coolant, and may include a dielectric coolant. Examples of suitable coolants include fluorocarbons, such as perfluorohexane (FC-72), perfluoro (FC-75), and/or perfluorotripentylamine (FC-70). FC-72, FC-75, and FC-70 are available under the tradename Flourinert® from the 3M Company of Maplewood, Minn.

A portion of coolant 104 in a liquid phase is disposed within a lower (relative to the direction of gravity) portion of the interior of sealed housing 102. A portion of coolant 104 in a vapor phase is disposed within an ullage space 120 in an upper (relative to the direction of gravity) portion of the interior of sealed housing 102. A surface 122 of liquid phase coolant 104 bounds ullage space 120, separating liquid phase coolant from vapor phase coolant contained within sealed housing 102. As will be appreciated by those of skill in the art in view of the present disclosure, the relative proportion of liquid phase coolant to vapor phase coolant is a function by the temperature of coolant 104 and internal pressure within sealed housing 102.

A condenser 124 is disposed within ullage space 120. Condenser 124 is in thermal communication with a heat exchanger 126 through a wall of sealed housing 102, heat exchanger 126 being disposed on an exterior of sealed housing 102 opposite condenser 124. Condenser 124 and heat exchanger 126 each have a plurality of fins for purposes of providing increased surface area for heat transfer, and as illustrated include discrete finned bodies connected to sealed housing 102. As will be appreciated by those of skill in the art, either or both of condenser 124 and heat exchanger 126 may be defined by sealed housing 102, such as by fins defined by one or more interior and/or exterior surfaces of the walls of sealed housing 102.

In the illustrated exemplary embodiment, PCB arrangement 106 includes a printed circuit board (PCB) 114, a solid-state switch device 116, and heat sink 118 that are disposed within sealed housing 102 and submerged within coolant 104. Solid-state switch device 116 is connected to a surface of PCB arrangement 106, and may include a field effect transistor device like a MOSFET or an insulated gate bipolar transistor (IGBT) device for a power converter. Heat sink 118 is connected to solid-state switch device 116, serves to increase the rate heat transfer from solid-state switch device 116 to coolant 104, and allows for relatively compact spacing of electrical components on the surface of PCB 114.

In the illustrated exemplary embodiment, variable-volume chamber 112 is defined within an elastic body 128. Elastic body 128 fluidly isolates variable-volume chamber 112 from coolant 104, is alterable in volume according to pressure exerted on elastic body 128 by coolant 104, and may include a metallic material 130, such as aluminum, steel, or alloys thereof. In the illustrated exemplary embodiment elastic body 128 is a metallic bellows having a plurality of segments and alterable between a first volume (shown in FIG. 1), a second volume (shown in FIG. 2) that is smaller than the first volume, and a third volume (shown in FIG. 3) that is smaller than the second volume in response to changes in pressure within the sealed housing. Although the exemplary embodiment described herein includes variable-volume chamber 112 disposed within fixed-volume sealed housing 102, it is to be appreciated and understood that in certain embodiments sealed housing 102 defines variable-volume chamber 112 and is itself alterable between at least a first volume and a second volume according to pressure within the sealed housing 102.

It is contemplated that elastic body 128 and variable-volume chamber 112 defined therein have a coefficient of thermal expansion that is different from the coefficient of thermal expansion of dielectric coolant 104. For example, variable-volume chamber 112 may be evacuated and sealed with respect to the interior of sealed housing 102. Alternatively, variable-volume chamber 112 can be occupied by a gas 132, the gas being sealed within variable-volume chamber 112 and fluidly isolated from the interior of sealed housing 102. It is also contemplated that variable-volume chamber 112 can be fluidly isolated from the interior of sealed housing 102 and in fluid communication with the environment external to sealed housing 102, such as through a vent or diaphragm structure 133. These arrangements allow the space occupied by variable-volume chamber 112 to change according to pressure within the interior of sealed housing 102, which in turn is influenced by the temperature of dielectric coolant 104. Thus, variable-volume chamber 112 reduces pressure rise within the interior of sealed housing 102 as a function of temperature increase by decreasing in volume, thereby causing sealed housing 102 to experience a smaller pressure gradient relative to ambient pressure for a given amount of heating, allowing sealed housing 102 to be less massive than would otherwise be necessary.

Figure 2:
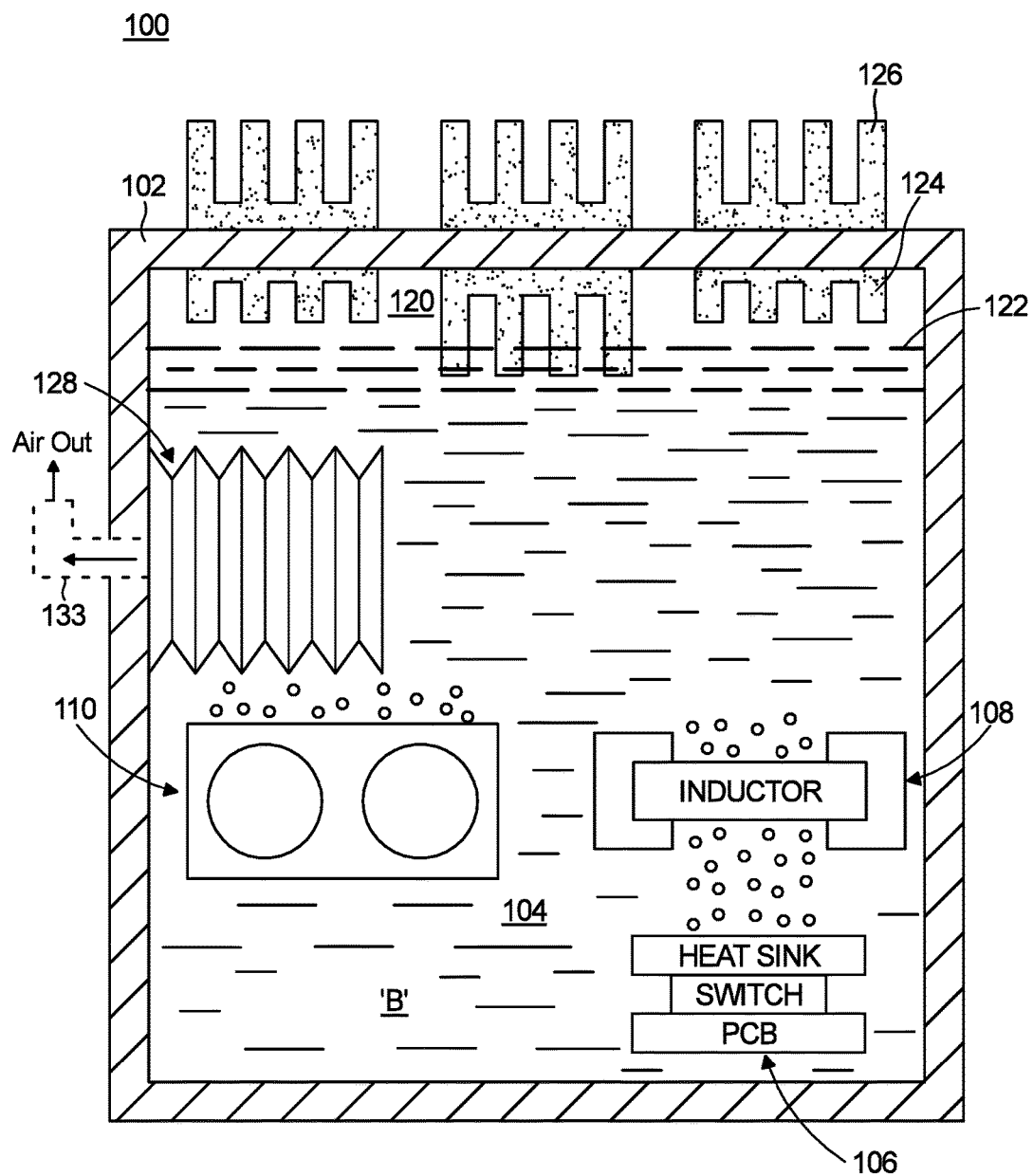
FIG. 2 is a schematic view of the immersion cooled electronics arrangement of FIG. 1, showing the variable-volume chamber decreasing in volume in response to pressure increase within the sealed housing from heating of the coolant.
Figure 3:
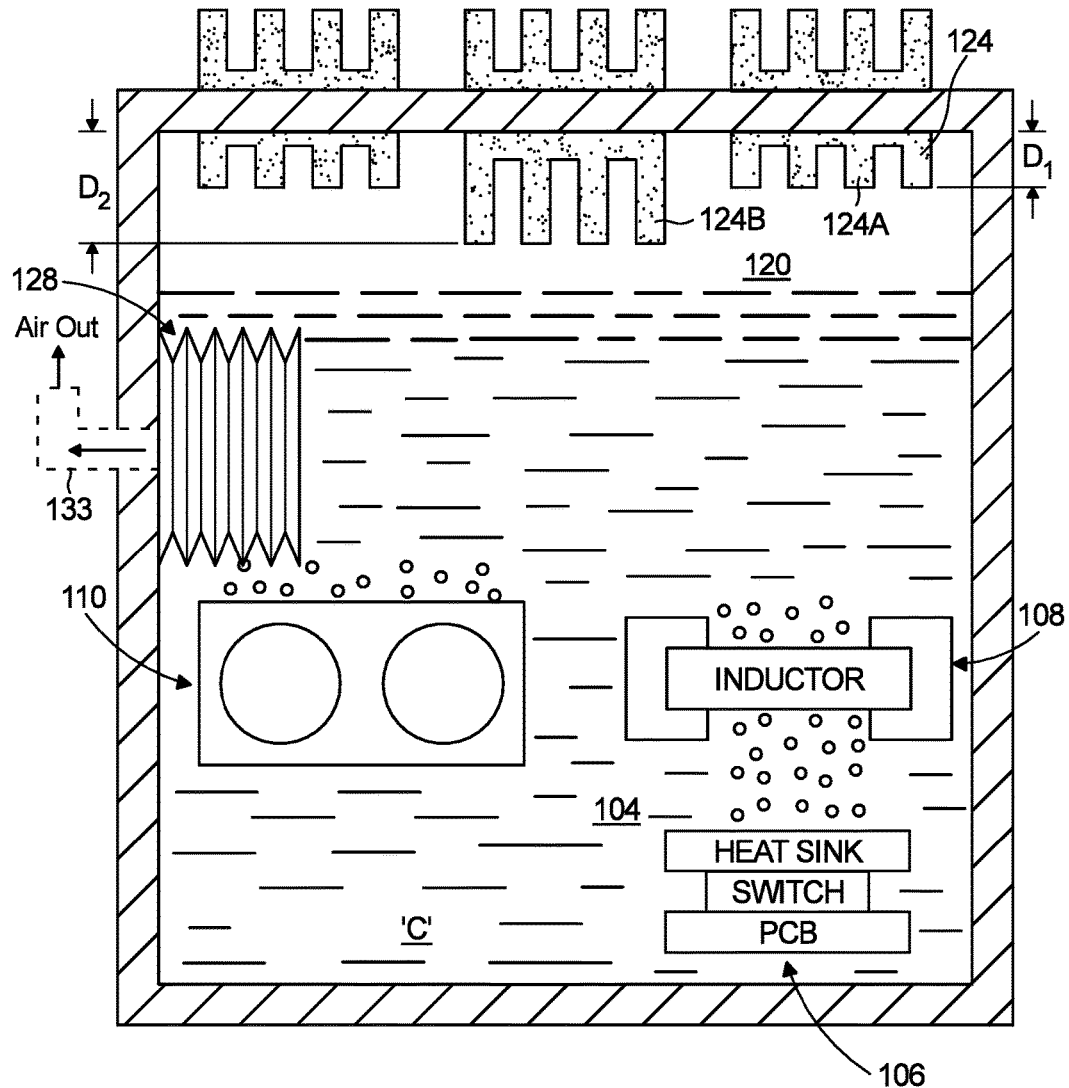
FIG. 3 is a schematic view of the immersion cooled electronics arrangement of FIG. 1, showing the variable-volume chamber decreasing further in volume in response to further pressure increase within the sealed housing from further heating of the coolant.

Referring now to FIGS. 1-3, immersion cooled electronics arrangement 100 is shown with variable-volume chamber 112 responding to increasing pressure within the interior of sealed housing 102. With reference to FIG. 1, variable-volume chamber 112 at a time A where dielectric coolant 104 is relatively cool and internal pressure within sealed housing 102 is relatively low.

With reference to FIG. 2, immersion cooled electronics arrangement 100 is shown at time B. At time B dielectric coolant 104 pressure within sealed housing 102 is higher than at time A, such as may result from dielectric coolant 104 having been heated during the intervening period between time A (shown in FIG. 1) and time B. Heating may be the result, for example, of heat absorbed from resistive heating of current-carrying elements of PCB arrangement 106, inductor 108, and/or capacitor 110, heat indicated with bubbles associated with nucleated boiling of dielectric coolant 104. As indicated by the decrease in volume of variable-volume chamber 112 shown in FIG. 2 in comparison to FIG. 1, variable-volume chamber 112 compresses in response to the increased pressure, reducing rate of pressure increase that would result within sealed housing 102 without variable-volume chamber 112 with heating of dielectric coolant 104.

With reference to FIG. 3, immersion cooled electronics arrangement 100 is shown at time C. At time C pressure within sealed housing 102 is higher than at time B, dielectric coolant 104 having been further heated during the intervening period between time B (shown in FIG. 2) and time C. Responsive to the increased pressure, variable-volume chamber 112 further decreases in volume, slowing the rate of pressure increase within the interior of sealed housing 102 that otherwise would result from the further heating of dielectric coolant 104.

Figure 4:
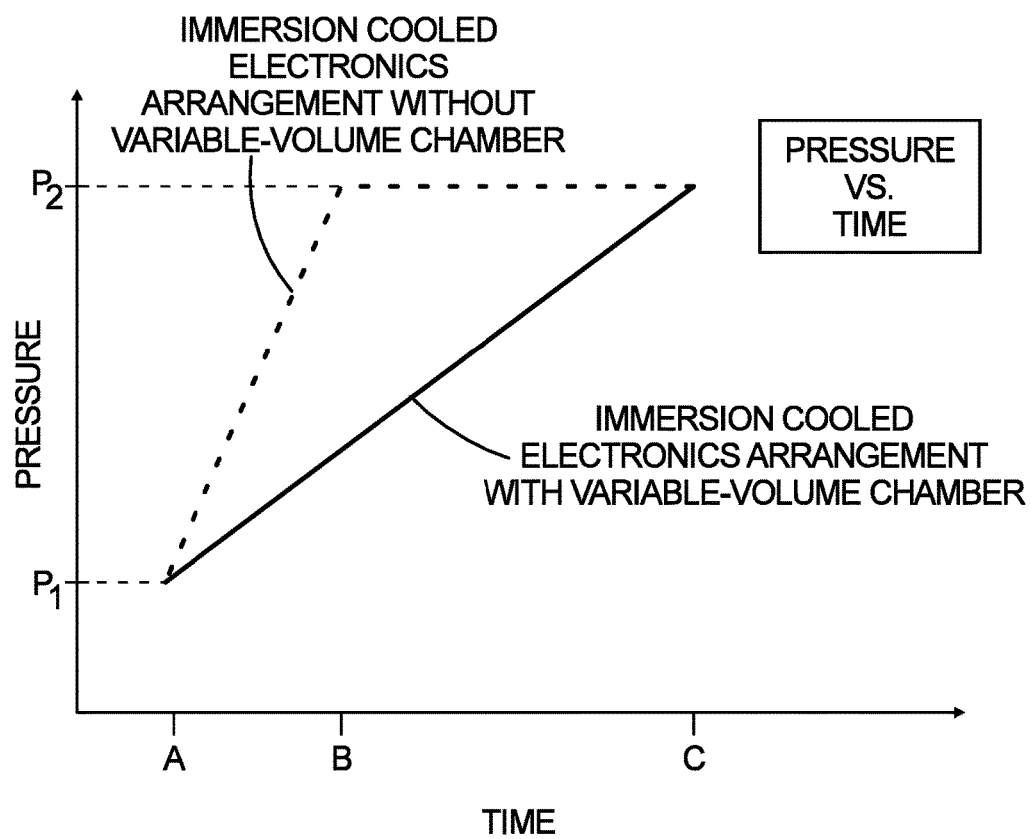
FIG. 4 is a graph of pressure change over time for the immersion cooled electronics arrangement of FIG. 1 in comparison to the immersion cooled electronics arrangement without the variable-volume chamber, showing the rate of pressure increase in the immersion cooled electronics arrangement of FIG. 1 being slower than the immersion cooled electronics arrangement not having a variable-volume chamber.

Referring to FIG. 4, a graph internal pressure versus time shown for immersion cooled electronics arrangement 100 (shown in solid line) in comparison to the immersion cooled electronics arrangement without variable-volume chamber 112 (shown in dashed line). Times A, time B, and time C are indicated on the x-axis; an initial pressure $P_1$ and a relief pressure $P_2$ are shown on the y-axis, $P_2$ representing a pressure where a vent valve opens to fluidly couple the interior of sealed housing 102 (shown in FIG. 1) to the external environment.

As indicated with the dashed-line in FIG. 4, the immersion cooled electronics arrangement without the variable-volume chamber exhibits a relatively steep pressure increase between time A and time B, reaching relief pressure $P_2$ at time B. Between time B and time C internal pressure remains constant, and continued heat input to the coolant causes vapor phase coolant to issue to the external environment.

As indicated with the solid-line in FIG. 4, the immersion cooled electronics arrangement having the variable-volume chamber experiences a more gradual internal pressure rise between time A and time C. The more gradual internal pressure increase is attributable to the decrease in the volume occupied by variable-volume chamber 112 (shown in FIGS. 1-3) between times A and C (shown in FIGS. 1-3), allowing immersion cooled electronics arrangement 100 to take longer to reach predetermined pressure $P_2$. In certain embodiments, the relatively gradual internal pressure provided by the reduction in volume of variable-volume chamber 112 (shown in FIGS. 1-3) allows for operation of the exemplary cooling arrangement without the need for service under conditions that would necessitate service of cooling arrangements not having a variable-chamber as described above.

Referring again to FIGS. 1-3, condenser 124 is shown with a segmented condenser body having segments with fins of differentiated heights. In the illustrated exemplary embodiment condenser 124 has a first fin 124A with a first height $D_1$ and a second fin 124B with a second height $D_2$. First height $D_1$ and second height $D_2$ each extend into sealed housing 102 to coolant 104 and downwards (relatively to gravity), second height $D_2$ being greater than $D_1$. The differing fin heights can cooperate with coolant liquid level changes within the sealed housing to change the rate of heat transfer from sealed housing 102 due to the change in the ratio of liquid and vapor phase coolant within sealed housing 102, as indicated by the lowering of the liquid level within sealed housing 102 at time C (shown in FIG. 3) and time B (shown in FIG. 2) relative to time A (shown in FIG. 1).

As will be appreciated by those of skill in the art in view of the present disclosure, the height differential cooperates with liquid level change within sealed housing 102 such that different portions of condenser 124 are bathed by coolant 104 according to liquid level within sealed housing 102, thereby providing a stepped change in heat transfer between condenser 124 and coolant 104. This allows for selecting different heat rejection paths according the temperature of dielectric coolant 104 via change in the liquid level 122. For example, at time A (shown in FIG. 1), pressure within the interior of sealed housing 102 is such that three heat rejection conduction paths extend through condenser 124. At time B (shown in FIG. 2), pressure within the interior of sealed housing 102 is such that only a single heat rejection conduction path extends through condenser 124. At time C (shown in FIG. 3), pressure within the interior of sealed housing 102 is such that no heat rejection conduction path extends through condenser 124.

Figure 5:
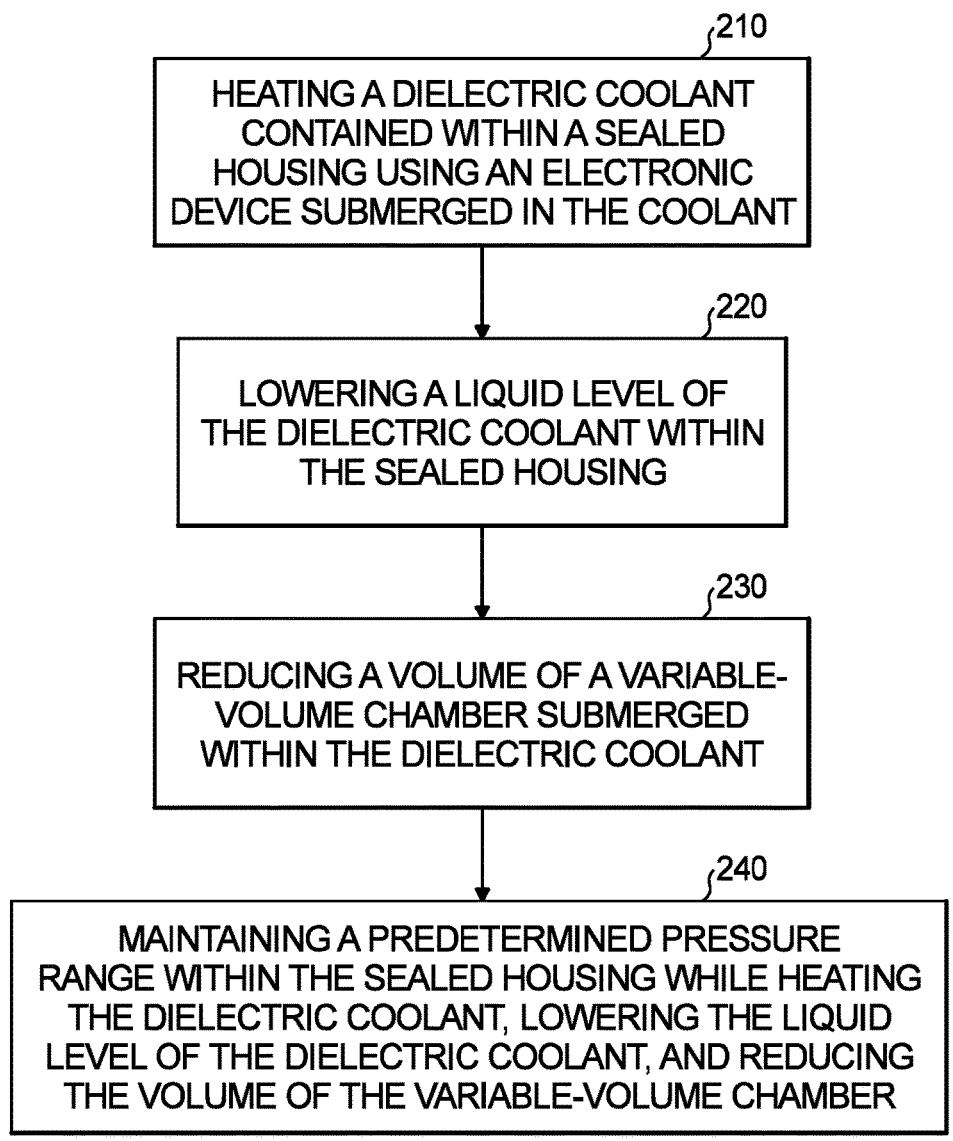
FIG. 5 is a diagram of a method of controlling pressure change within an immersion cooled electronics arrangement, showing steps of the method.

With reference to FIG. 5, a method 200 of controlling pressure rise in an immersion cooled electronics arrangement is shown. Method 200 includes heating a coolant, e.g., coolant 104 (shown in FIG. 1), contained within the interior of a sealed housing, e.g., sealed housing 102 (shown in FIG. 1), using an electronic device, e.g., PCB arrangement 106 (shown in FIG. 1), as shown with box 210. Method 200 also includes changing the liquid level, e.g., liquid level 122 (shown in FIG. 1) of the dielectric coolant within the interior of sealed housing, as shown with box 220. Changing the liquid level can include lowering (relative to gravity) the liquid level by vaporizing with heat from the electronic component dielectric coolant disposed within the interior sealed housing. Changing the liquid level can include increasing the liquid level by condensing dielectric coolant disposed within the sealed housing in vapor form.

Method 200 further includes reducing the volume of the variable-volume chamber, e.g., variable-volume chamber 112, disposed within the sealed housing, in response to pressure increase associated with the heating of the dielectric coolant, as shown with box 230. Method 200 can additionally include maintaining pressure within predetermined pressure range within the interior of the sealed housing while heating the coolant, changing the liquid level, and changing the volume of the variable-volume chamber, as shown with box 240. The predetermined pressure range can be smaller than the pressure range over a period of time that would otherwise be associated with the temperature change for the sealed housing.

The methods and systems of the present disclosure, as described above and shown in the drawings, provide for immersion cooled electronic devices with superior properties including improved pressure control. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An immersion cooled electronics arrangement, comprising:
a sealed housing;
a coolant contained within the sealed housing; and
an electronic device disposed within the sealed housing and in thermal communication with the coolant, a volume of the sealed housing being alterable between at least a first volume and a second volume in response to changes in pressure within the sealed chamber to reduce the rate of pressure change over time in the sealed housing from heating of the coolant,
wherein the sealed housing and the coolant define therebetween an ullage space; and
a variable-volume chamber disposed within the sealed housing fluidly isolated from the coolant,
wherein the variable-volume chamber is in fluid communication with the environment external to the sealed housing.

2. The immersion cooled electronics arrangement as recited in claim 1, wherein the sealed housing has a fixed internal volume.

3. The immersion cooled electronics arrangement as recited in claim 1, further including a gas sealed within the variable-volume chamber.

4. The immersion cooled electronics arrangement as recited in claim 1, wherein the variable-volume chamber encloses an evacuated space sealed from an interior of the sealed housing.

5. The immersion cooled electronics arrangement as recited in claim 1, wherein the variable-volume chamber is submerged within the coolant.

6. The immersion cooled electronics arrangement as recited in claim 1, further including a bellows defining a variable-volume chamber disposed within the sealed housing.

7. The immersion cooled electronics arrangement as recited in claim 6, wherein the bellows includes a metallic material.

8. The immersion cooled electronics arrangement as recited in claim 1, further including a condenser disposed within the ullage space.

9. The immersion cooled electronics arrangement as recited in claim 1, further including a heat exchanger coupled to the housing opposite the ullage space.

10. The immersion cooled electronics arrangement as recited in claim 9, wherein the condenser includes a first fin and a second fin having lengths extending towards the coolant, the second fin having length that is greater than the length of the first fin.

11. The immersion cooled electronics arrangement as recited in claim 1, wherein the electronic devices comprises at least one of a capacitor, an inductor, a printed circuit board, a solid-state switch device, heat sink, a solid-state power converter, and a motor controller.

12. The immersion cooled electronics arrangement as recited in claim 1, wherein the coolant includes a dielectric coolant.

13. The immersion cooled electronics arrangement as recited in claim 1, wherein the electronic device is at least partially submerged within the coolant.

14. An aircraft electrical system electronics cooling arrangement, comprising:
a sealed housing;
a coolant contained within the sealed housing;
an electronic device including a solid-state power converter disposed within the housing and at least partially submerged within the coolant; and
a bellows defining a variable-volume chamber submerged within the coolant, the variable-volume chamber being alterable between at least a first volume and a second volume in response to changes in pressure within the sealed chamber to reduce change in pressure within the sealed housing,
wherein the variable-volume chamber is fluidly isolated from the interior of the sealed housing and is in fluid communication with the environment external to the sealed housing, and
wherein the sealed housing defines a variable-volume chamber and is itself alterable between a first volume and a second volume according to pressure within the sealed housing.

15. A method of controlling pressure within a sealed housing of an immersion cooled electronics arrangement, comprising:
heating coolant contained within a sealed housing using an electronic device disposed within the housing;
increasing pressure within the sealed housing;
decreasing volume of a variable-volume chamber disposed within the housing using the increased pressure within the sealed housing; and
lowering a liquid level within the sealed housing in response to the increased pressure within the housing,
wherein decreasing volume of the variable-volume chamber includes issuing fluid from the variable-volume chamber to the environment external to the sealed housing.

16. An immersion cooled electronics arrangement, comprising:
a sealed housing with an interior;
a coolant contained within the interior of the sealed housing;
a variable-volume chamber disposed within the sealed housing and submerged within the coolant, wherein the variable-volume chamber is fluidly isolated from the interior of the sealed housing;
a vent fluidly coupling the variable-volume chamber with the environment external to the sealed housing; and
an electronic device disposed within the sealed housing and in thermal communication with the coolant,
wherein a volume of the sealed housing being alterable between at least a first volume and a second volume in response to changes in pressure within the sealed chamber to reduce the rate of pressure change over time in the sealed housing from heating of the coolant.

* * * * *